US007952424B2

(12) United States Patent
Sanduleanu et al.

(10) Patent No.: US 7,952,424 B2
(45) Date of Patent: May 31, 2011

(54) DIFFERENTIAL CHARGE PUMP WITH COMMON MODE CONTROL

(75) Inventors: Mihai Adrian Tiberiu Sanduleanu, Eindhoven (NL); Dave Willem Van Goor, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 262 days.

(21) Appl. No.: 10/569,124

(22) PCT Filed: Aug. 6, 2004

(86) PCT No.: PCT/IB2004/051412
§ 371 (c)(1),
(2), (4) Date: Feb. 23, 2006

(87) PCT Pub. No.: WO2005/022752
PCT Pub. Date: Mar. 10, 2005

(65) Prior Publication Data
US 2006/0220711 A1    Oct. 5, 2006

(30) Foreign Application Priority Data
Aug. 29, 2003    (EP) .................................. 03103252

(51) Int. Cl.
*G05F 1/10* (2006.01)
*G05F 3/02* (2006.01)
(52) U.S. Cl. ...................................................... 327/536
(58) Field of Classification Search .................. 327/541, 327/157, 148
See application file for complete search history.

(56) References Cited

U.S. PATENT DOCUMENTS

| 5,736,880 | A | * | 4/1998 | Bruccoleri et al. | ........... 327/157 |
| 6,265,946 | B1 | | 7/2001 | Bartlett | |
| 2001/0052807 | A1 | | 12/2001 | Vaucher | |
| 2003/0034813 | A1 | | 2/2003 | Sanduleanu | |
| 2004/0041603 | A1 | * | 3/2004 | Abidin et al. | .................. 327/157 |
| 2005/0083090 | A1 | * | 4/2005 | Moraveji | ....................... 327/157 |

FOREIGN PATENT DOCUMENTS

| JP | 11163636 A | 6/1999 |
| JP | 2000-349627 | 12/2000 |
| JP | 2002-026727 | 1/2002 |
| WO | WO 00/60806 A | 10/2000 |

OTHER PUBLICATIONS

Sedra, Adel S., Smith, Kenneth C., "Microelectronic Circuits," 2004, Oxford University Press, 5th Edition, p. 563.*
International Search Report dated Oct. 5, 2004 in connection with PCT Application No. PCT/IB2004/051412.
Written Opinion of the International Searching Authority dated Oct. 1, 2004 in connection with PCT Application No. PCT/IB2004/051412.

* cited by examiner

*Primary Examiner* — Lincoln Donovan
*Assistant Examiner* — Daniel Rojas

(57) ABSTRACT

Charge pump for providing an output current for charging and discharging a filter in accordance with an input signal, said charge pump comprising a first current source connectable with the input signal for driving the current source and adapted to providing a first current equal to a constant current Io plus a variable current Δx, said variable current Δx being directly proportional to the input signal, a second current source connectable with the input signal for driving the current source and adapted to providing a second current equal to the constant current $I_o$ minus said variable current Δx, and an output for providing the output current, wherein said output is connected to both the first and second current source in such a way, that the output current is equal to a difference between the first and second current.

10 Claims, 11 Drawing Sheets

DIFFERENTIAL CHARGE PUMP WITH COMMON MODE CONTROL

CROSS-REFERENCE TO RELATED APPLICATION(S)

The present application claims priority under 35 U.S.C. §365 to International Patent Application No. PCT/IB2004/051412 filed Aug. 6, 2004, entitled "DIFFERENTIAL CHARGE PUMP WITH COMMON MODE CONTROL". International Patent Application No. PCT/IB2004/051412 claims priority under 35 U.S.C. §365 and/or 35 U.S.C. §119(a) to European Patent Application No. 03103252.7 filed Aug. 29, 2003 and which are incorporated herein by reference into the present disclosure as if fully set forth herein.

Clock and data recovery (CDR) is a critical function in high-speed transceivers. Such transceivers serve many applications including optical communication. The data received in these systems are both asynchronous and noisy, requiring that a clock be abstracted to allow synchronized operations. Furthermore, the data must be retimed such that the jitter accumulated during transmission is removed.

Figure 1:
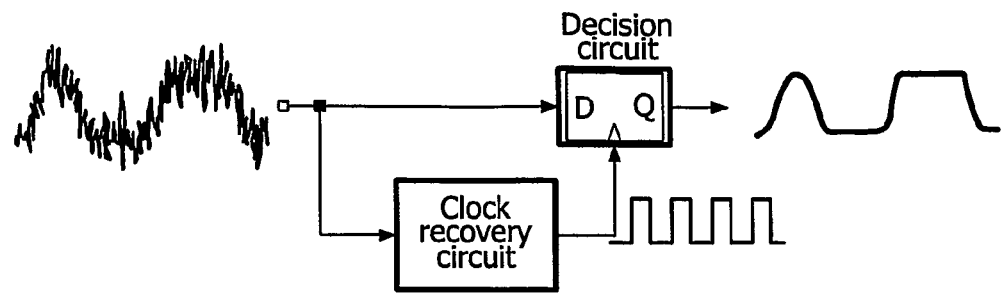

In order to perform synchronous operations such as retiming and de multiplexing on random data, the high-speed transceivers must generate a clock. As illustrated in FIG. 1 a clock recovery circuit senses the data and produced a periodic clock. A D-flip-flop (DFF) given by the clock then retimes the data, i.e. it samples the noisy data. The D-flip-flop is called a decision circuit in FIG. 1. This yields an output with less jitter.

The clock generated in the circuit in FIG. 1 must satisfy three important conditions:

It must have a frequency equal to the data rate. For example, a data rate of 10 Gb/s translates to a clock frequency of 10 GH (with a period of 100 ps), The clock must bear a predefined phase relationship with respect to the data, allowing optimum sampling of the bits by the clock. If the rising edges of the clock coincide with the mid point of each bit, the sampling occurs farthest form the preceding and following data transitions. A maximum margin for jitter and other timing uncertainties may be provided in this way, The clock must exhibit a small jitter since it is the principal contributor to the retime data jitter.

Figure 2:
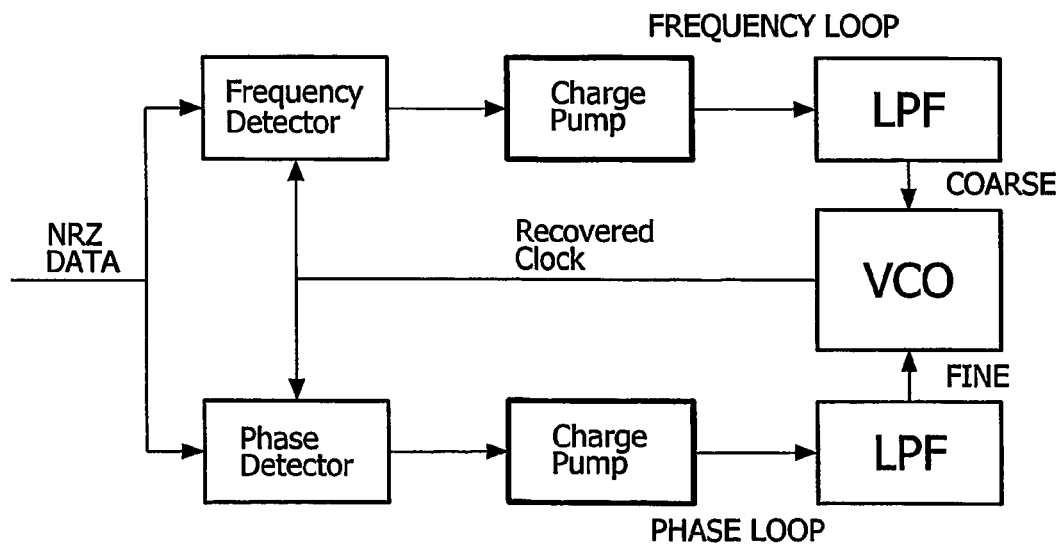

FIG. 2 shows a conventional clock recovery circuit. The clock recovery circuit comprises a voltage-controlled oscillator VCO, which is responsible for outputting the clock signal as shown in FIG. 1. The transitions of the clock signal output by the voltage controlled oscillator VCO has to be synchronized with the transitions of the input random data (NRZ data). The circuit shown in FIG. 2 has two parallel feedback loops. The first one called frequency loop adjusts the frequency of the voltage-controlled oscillator VCO to the frequency of the estimated clock of the input data. The frequency loop comprises a frequency detector, a charge pump and a low pass filter (LPF). The second feedback loop of FIG. 2 is the phase loop. The phase loop comprises a phase detector, a charge pump and a low pass filter LPF. The phase detector compares the phase of the data transitions (NRZ data transitions) with the phase of the recovery clock. For a linear phase detector the pulse width must be proportional to the detected phase difference. The low pass filter LPF integrates the pulses output by the phase detector and the output voltage of this filter drives the fine-tuning input of the voltage-controlled oscillator VCO. The output of the low pass filter in the phase loop has amplitude proportional to the phase difference detected by the phase detector. The charge pump circuits are needed to ensure a linear charging/discharging of the low pass filter LPF inside the frequency and phase loops. The low pass filter integrates the signals output by the charge pump.

Charge pump circuits are needed to ensure a linear charging/discharging of the filters inside the phase locked loop. The input of the charge pump can be a fast series of pulses. A fast switching between both states of the input of the charge pump must be ensured. The output of the low pass filter LPF must be a linear representation of the phase error or frequency error in the form of charge on the capacitor of the low pass filter. Charge pumping consists of charging/discharging of a capacitor. When using a simple capacitor, the voltage on the capacitor is:

$$V = V_i + \frac{1}{C}\int_t^0 I(t)\,dt$$

$V_I$ represents the initial voltage on the capacitor and $I(t)$ is the current charging the capacitor. When the current input to the low pass filter is constant, then the voltage on the capacitor will be a ramp, which linearly increases/decreases in time:

$$V_C = V_I + \frac{I_0 * t}{C},$$

where $I_0$ is the constant current of the charge pump, C is the capacitance of the capacitor and t represents time.

Figure 3A:
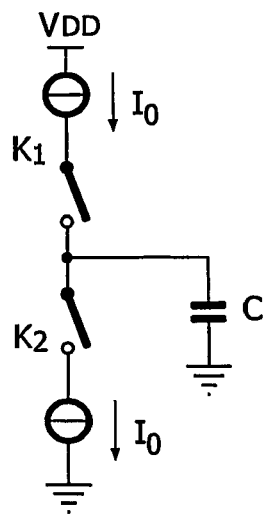
Figure 3B:
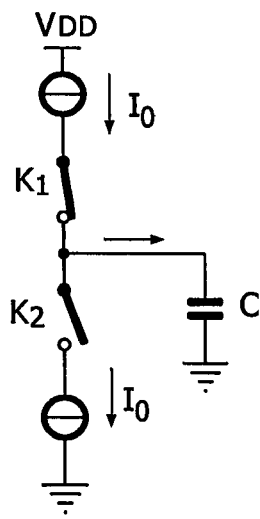
Figure 3C:
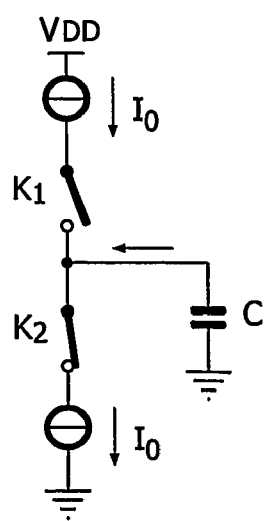

The simplest implementation of this principal is represented in FIGS. 3A, 3B and 3C. FIGS. 3A to 3C represent a simple charge pump according to the state of the art, wherein the charge pumps are shown in different states. In FIG. 3A, the charge pump is not charging at all. In FIG. 3B, the charge pump is charging a capacitor C. In FIG. 3C, the charge pump is discharging the capacitor C. The charge pumps shown in FIGS. 3A to 3B comprise two current sources I0, which provide a constant current I0. The current sources I0 are connected via two switches K1 and K2 to each other. An operating voltage is provided to one of the current sources I0. The other current source is connected to ground. The capacitor C is connected to both switches K1 and K2. If both switches K1 and K2 are open, the voltage drop across the capacitor C remains unchanged (FIG. 3A). If the first switch K1 is closed and the second switch K2 remains open, a current I0 is provided to the capacitor (FIG. 3B). The capacitor C is charged. A voltage drop across the capacitor increases linearly in time. If the first switch K1 is open and the second switch K2 is closed (FIG. 3VC) a constant current I0 flows from the capacitor C to the current source connected to ground. The capacitor is discharged linearly.

The circuit needs two input commands in order to drive the switches K1 and K2. The first input command UP driving the first switch K1 and the second input command DOWN driving the second switch K2 are shown exemplary in FIG. 3. Furthermore FIG. 3 shows the influence of the input commands on the output voltage of the capacitor $V_c$ versus time. When both signals UP and DOWN are low, the output voltage $V_c$ remains unchanged. If the UP signal is high, the output voltage $V_c$ increases linearly in time for the duration of the UP pulse. If the DOWN signal is high, then the output voltage $V_c$ decreases linearly in time for the duration of the DOWN pulse.

Figure 4:
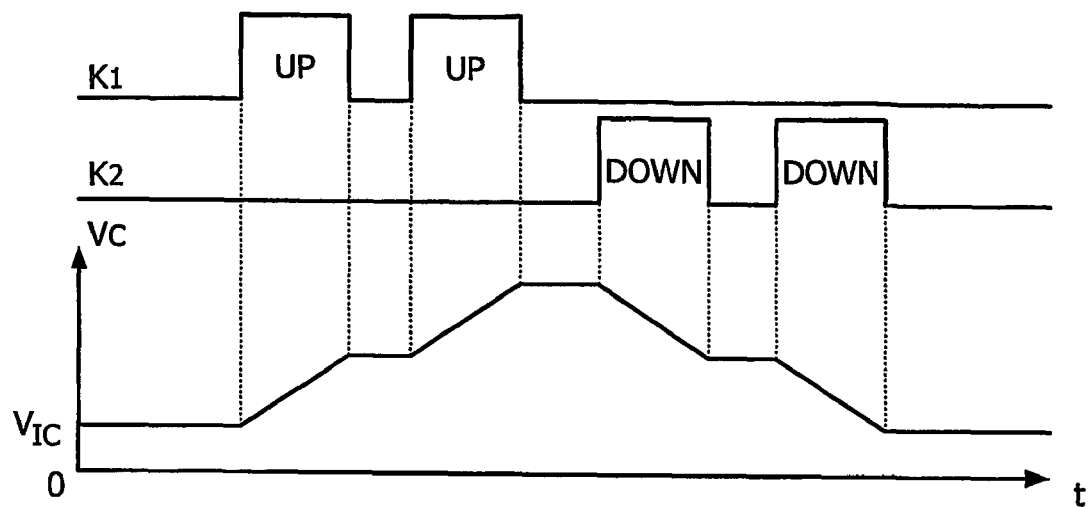
Figure 5:
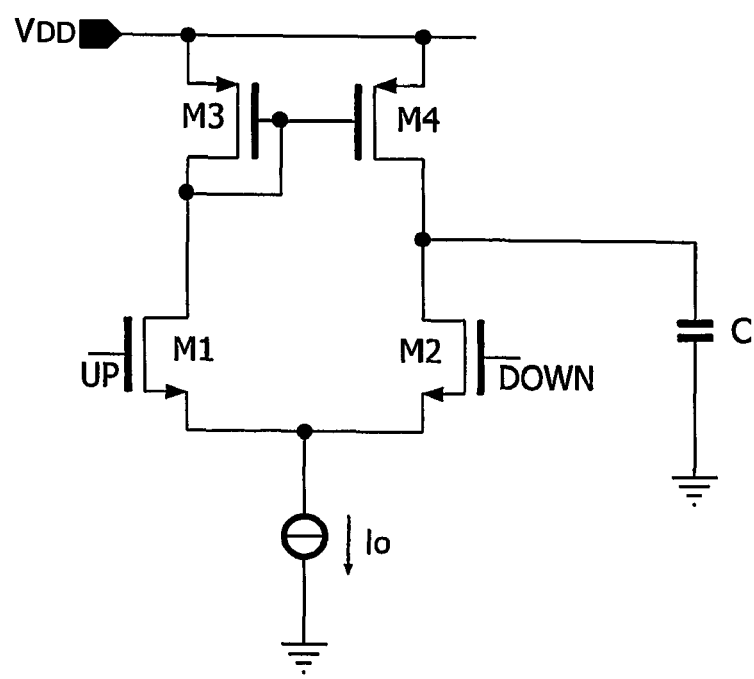

FIG. 5 shows another charge pump according to the state of the art. The charge pump of FIG. 5 is also driven by two input signals UP and DOWN and the output current is provided to a capacitor C connected to ground. FIG. 4 also represents the influence of the input signals UP and DOWN on the voltage across the capacitor C. The working principal of the charge pump of FIG. 5 corresponds to the working principal of the charge pump shown in FIGS. 3A to 3C. The UP signal is provided to a gate of a transistor M1. A current source providing the current I0 is connected to the source of the transistor M1. The transistor M1 is operated as a switch. Whenever a high signal is applied to the gate of transistor M1, the current I0 flows through the transistor M1 (as long as transistor M2 is locked). Transistor M2 is connected to the current source in the same way as transistor M1. Transistor M2 shown in FIG. 5 is also operated as a switch. Furthermore two transistors M3 and M4 are provided in FIG. 5. Transistors M3 and M4 form a current mirror. The current flowing through the drain of transistor M3 is mirrored to the drain of transistor M4. The mirror ratio is 1:1. If signal UP is high and signal DOWN is low, then the current I0 flows through transistor M1. I0 is mirrored to the drain of transistor M4. The drain of M4 is connected to the capacitor C and the drain of M2. Since M2 is locked, the current I0 flows to transistor C, thereby charging transistor C linearly. If the transistor M1 is locked and transistor M2 is switched, then a current I0 flows from the capacitor C to the transistor M2. The capacitor C is discharged.

The advantages of the circuit of FIG. 5 consist in its simplicity. The disadvantages of this circuit are the following:

The speed of the charge pump is limited by the time needed for the propagation of the current I0 through the current mirror represented by transistors M3 and M4. The speed is further limited by the time needed to switch the transistors M1 and M2 completely from a saturated state to a blocked state.

The output swing of the circuit is small. The charge pump of FIG. 5 is a rail-to-rail circuit. A certain amount of voltage is needed to keep the current source I0 in saturation. Therefore, the gain of the voltage-controlled oscillator has to be increased, in order to compensate for the limited swing. This increases the phase noise and sensitivity towards perturbation of the voltage controlled oscillator VCO.

The noise rejection capabilities of the charge pump of FIG. 5 are limited. The perturbation will contribute as a charge on the output capacitor C. Differential circuits are used to decrease the susceptibility of the charge pump towards noise influence.

Figure 6:
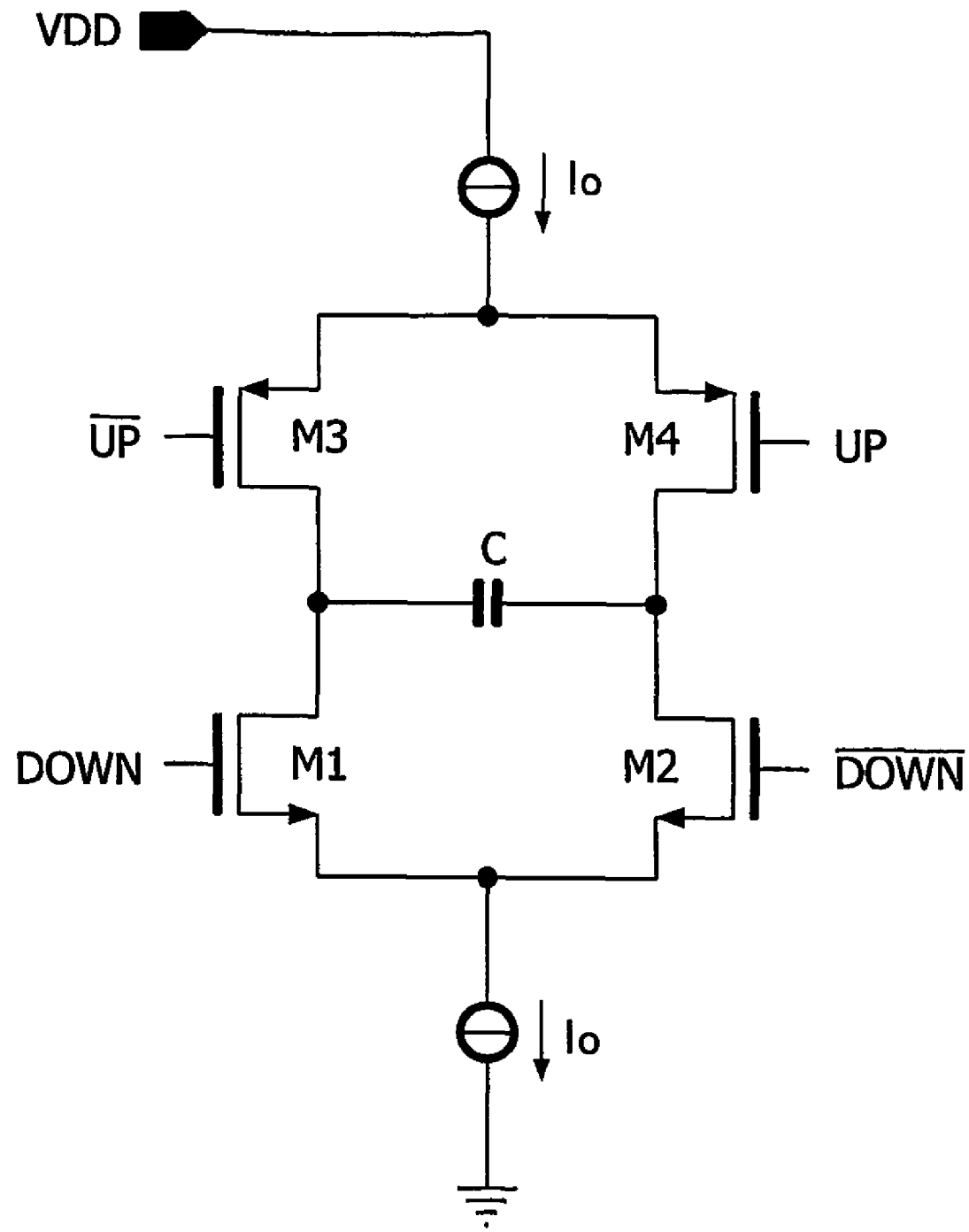

FIG. 6 shows a differential charge pump according to the state of the art. The differential circuit has a better immunity towards the supply and substrate noise due to the strong rejection of common mode noise. Also the practical implementation of a capacitor in the single ended solution gives extra parasitic capacitances in parallel with the capacitor of the low pass filter LPF. In differential mode shown in FIG. 6, the capacitor of the filter can be laid out such that the parasitic capacitances are not part of the differential filter. The circuit of FIG. 6 comprises four transistors M1, M2, M3 and M4 as well as two current sourced I0. The four transistors M3 to M4 are operated as switches. Transistor M1 is driven by an input signal DOWN and transistor M2 is driven by an input signal DOWN' representing the inverted input signal DOWN. The drains of the transistors M1 and M2 are connected to a capacitor C on opposite sides and the sources of transistors M1 and M2 are connected to ground via a current source I0. The gate of transistor M4 is connected to the input signal UP and the gate of transistor M3 is connected to the inverted input signal UP'. The sources of both transistors M3 and M4 are connected to each other and a current source I0. The drains of both transistors M3 and M4 are connected to the capacitor C on opposite side. The capacitor C is differentially charged/discharged from the current sources I0. Both input signals UP and DOWN are high, the current I0 flows through transistors M3 and M1 to ground. A voltage drop across the transistor C remains unchanged. If the input signals UP and DOWN differ, then the capacitor is either charged or discharged.

The main drawbacks of the circuit are:

It is not a rail-to-rail circuit due to the needed voltage room for the current source I0.

Figure 7A:
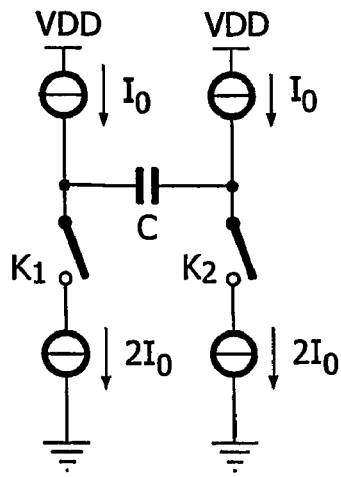
Figure 7B:
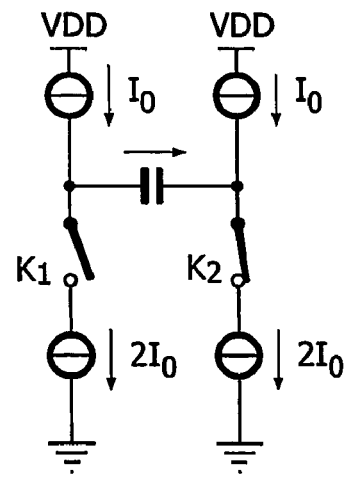
Figure 7C:
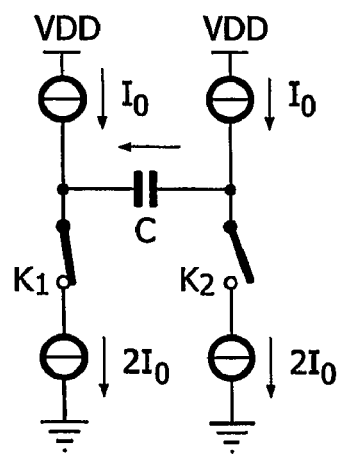

The configuration of the circuit comprises PMOS transistors (M3 and M4) as well as NMOS transistors (M1 and M2). That is why it is almost impossible to build two driver for the PMOS and NMOS transistors with equal delay, such that the UP and DOWN pulses do not experience delays with respect to each other. FIGS. 7A to 7C show a further differential charge pump according to the state of the art. The charge pump is shown in different states. The charge pump of FIGS. 7A to 7C comprises two switches K1 and K2. These switches may both be implemented with NMOS-transistors. The drawback of utilizing and NMOS and PMOS switches simultaneously of the charge pump of FIG. 5 is eliminated. The differential charge pump of FIGS. 7A to 7C comprises two current sources providing a constant current I0 and two current sources providing a constant current 2*I0. Two switches K1 and K2 further provided in the circuit of FIGS. 7A to 7C. The current source I0, the switch K1 and the current source 2I0 are connected to each other in line. The current source 2I0 is connected to ground. Whenever the switch K1 is open, the current I0 flows to a capacitor C. When the switch K1 is closed, the current I0 flows away from the capacitor C. The other current source I0, the switch K2 and the other current source 2I0 are connected in the same way to each other.

The major drawback of this differential charge pump is the fact, that it cannot follow fast pulses as in the case of the charge pump shown in FIG. 3.

It is therefore object of the present invention, to provide a charge pump, which overcomes the problems of the state of the art.

The charge pump according to the present invention comprises two current sources. A first current source is adapted to be driven by an input signal. The first current source provides a constant current I0 plus a variable current Δx, said variable current Δx being directly proportional to the input signal. The second current source is also adapted to be driven by the input signal. The output signal of the second current source is equal to a constant current I0 minus the variable current Δx. Therefore, the difference between the first current and the second current is equal to 2Δx. The charge pump further comprises an output for providing the output current. The output is connected to both the first and second current source in such a way, that the output signal is equal to a difference between the first and second current provided by the first and second current source. The size of the output current is equal to 2Δx. The current Δx is directly proportional to the input signal. Therefore, the variable current Δx is doubled at the output, in order to charge a capacitor. Since the current I0 is modulated by the input signal around a constant current I0, transistors of the circuit may be switched between two different saturated states and not between saturated and blocked states as in the state of the art. The transitions of the transistors from a saturated state to another saturated state is faster than switching transistors between a blocked state and a saturated state.

Preferably, the first current sources adapted to providing the first current to the output and the second current sources adapted to receiving the second current from the output. Alternatively, the second current source may be adapted to providing the second current to the output in the first current source may be adapted to receiving the first current from the output. In both cases the current flowing to and from the output is equal to two times Δx. The difference between the two implementations is the fad that the direction of the current is reversed.

The charge pump according to the present invention may have an output comprising two output terminals, a first output terminal and a second output terminal. Each output terminal may be connected to both of first and second current sources in such a way, that the output current at the first and second output terminal is equal to the difference between the first and second current. This differential charge pump may charge a capacitor opposite sides.

Preferably, the charge pump comprises further a common mode rejection circuit for controlling the common mode level at the output. The common mode rejection circuit is connected to the first and second output terminal. It is adapted to adding and subtracting the same current from both current sources. The common mode level at the output influences the oscillation frequency of a voltage control oscillator connected to the charge pump. That is why it should be well controlled.

Preferably, current mirrors are used in order to provide the first and the second current to the first and second output terminal. Therefore, a first current mirror having a mirror ratio of 1:1 is adapted to mirroring the first current provided to the first terminal to the second terminal. A second current mirror having the same mirror ratio 1:1 is adapted to mirroring the second current provided to the second terminal to the first terminal.

Preferred embodiments of the present invention are described with reference to the accompanied drawings below.

Figure 8:
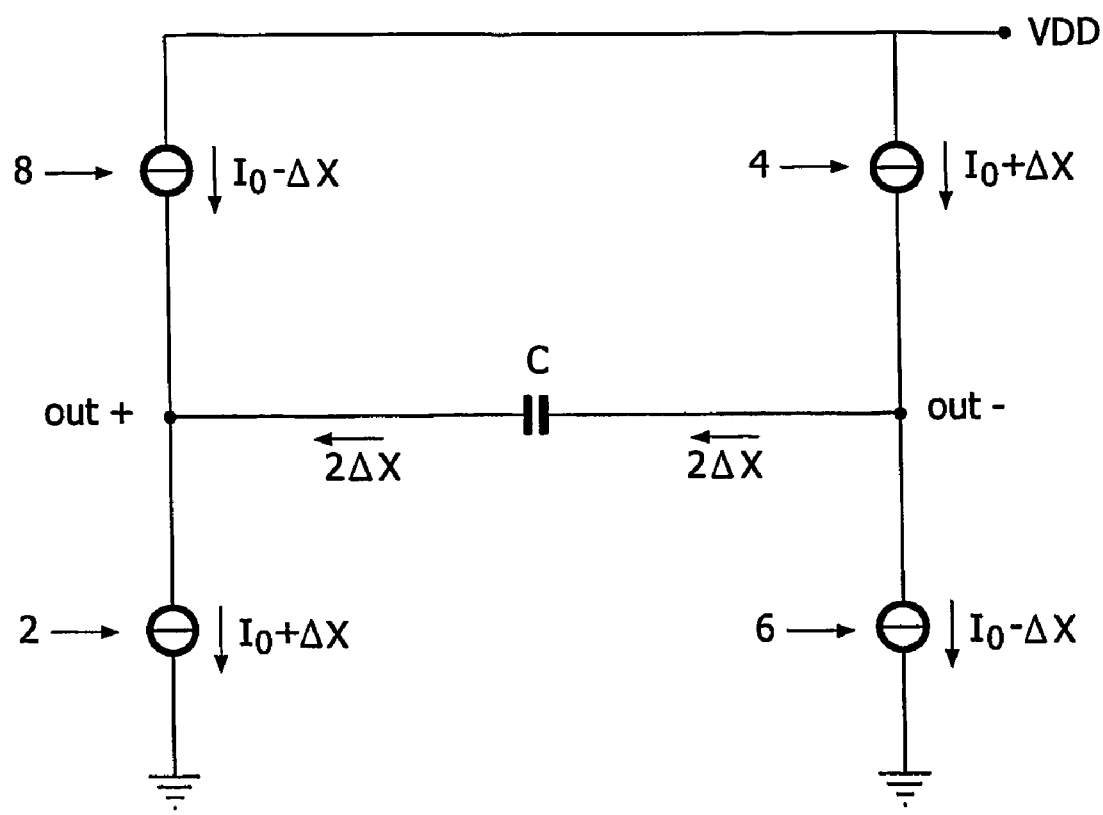
Figure 9:
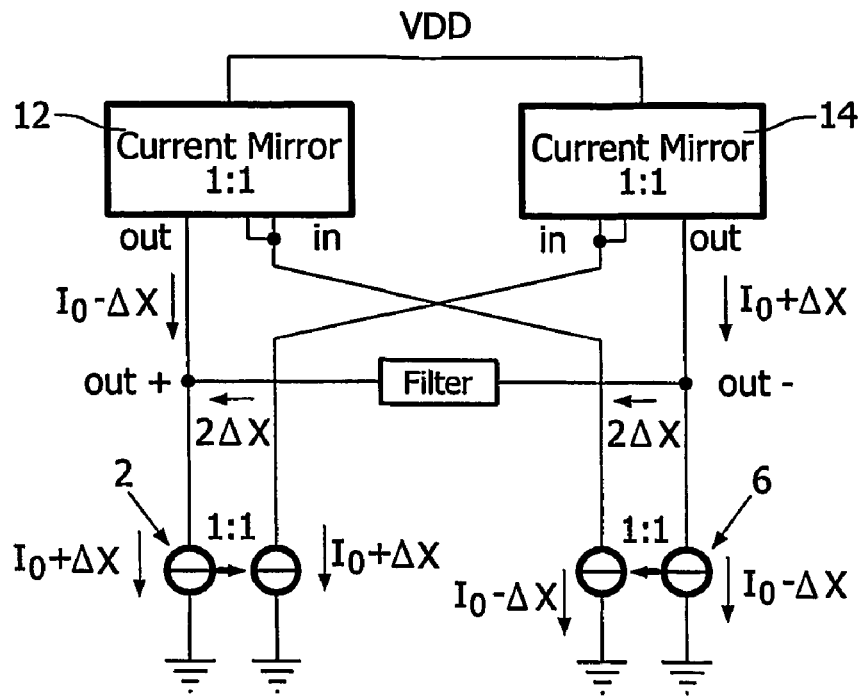
Figure 10:
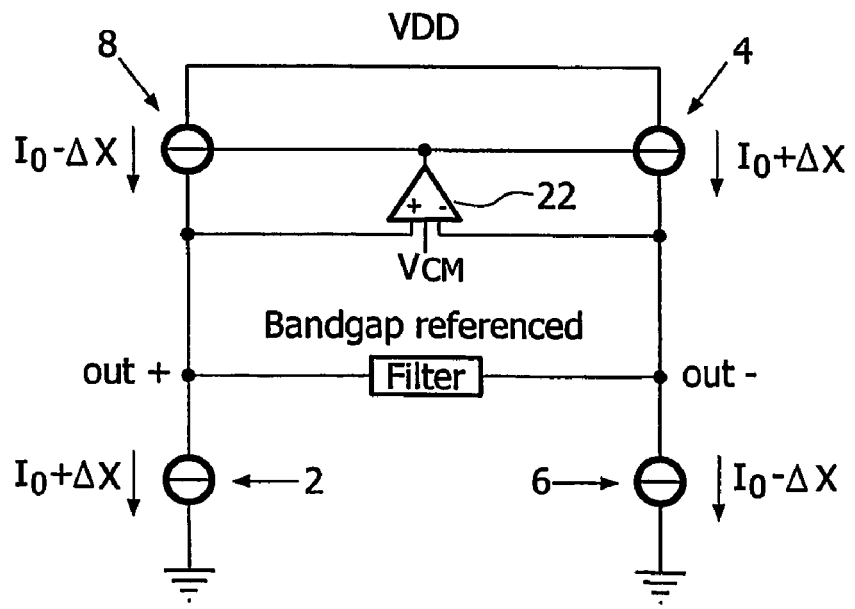
Figure 11:
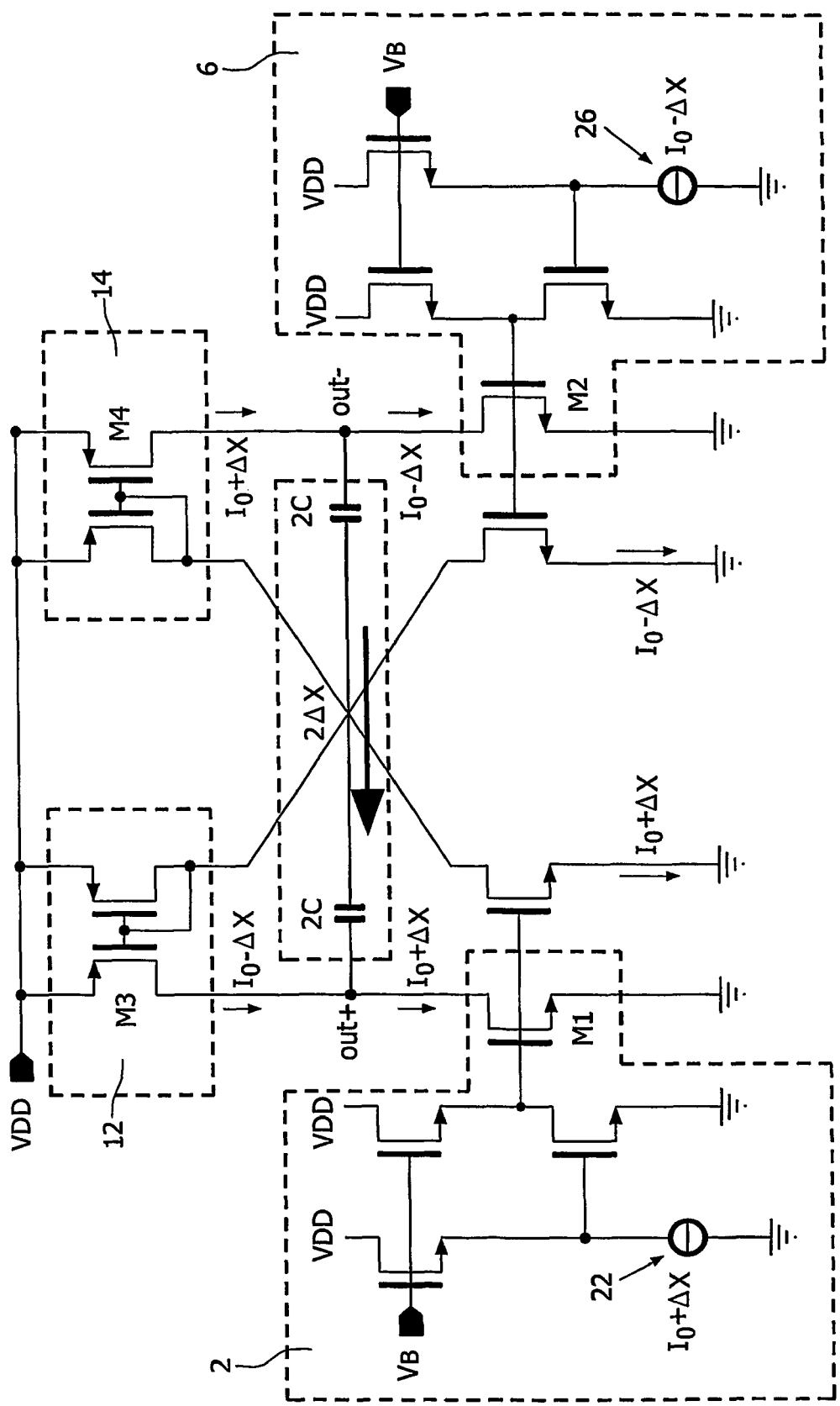
Figure 12:
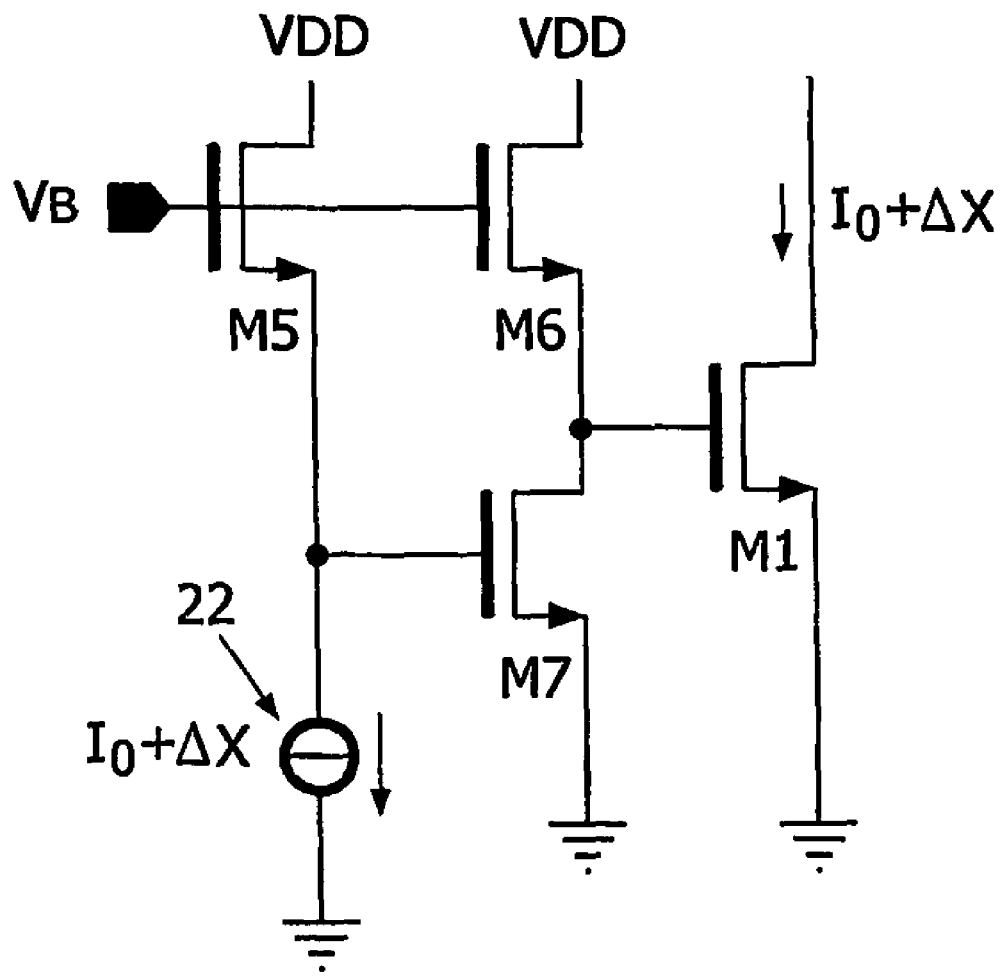
Figure 13:
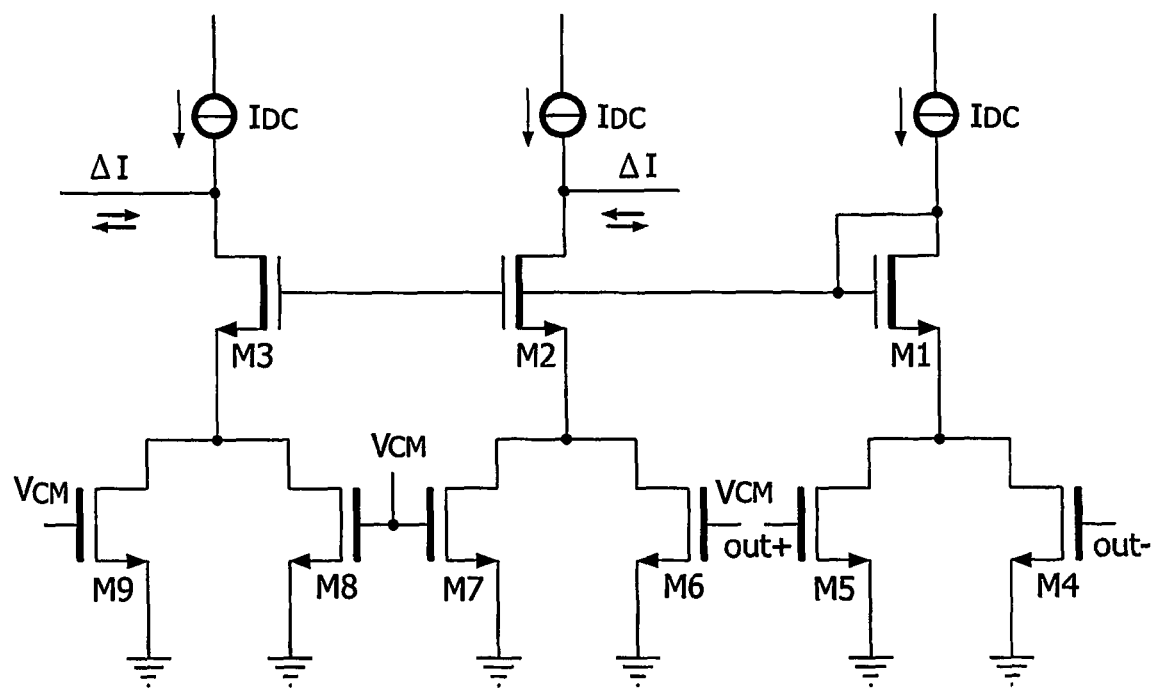
Figure 14:
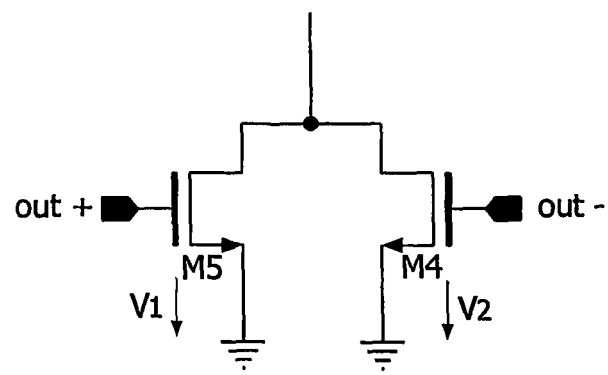
Figure 15:
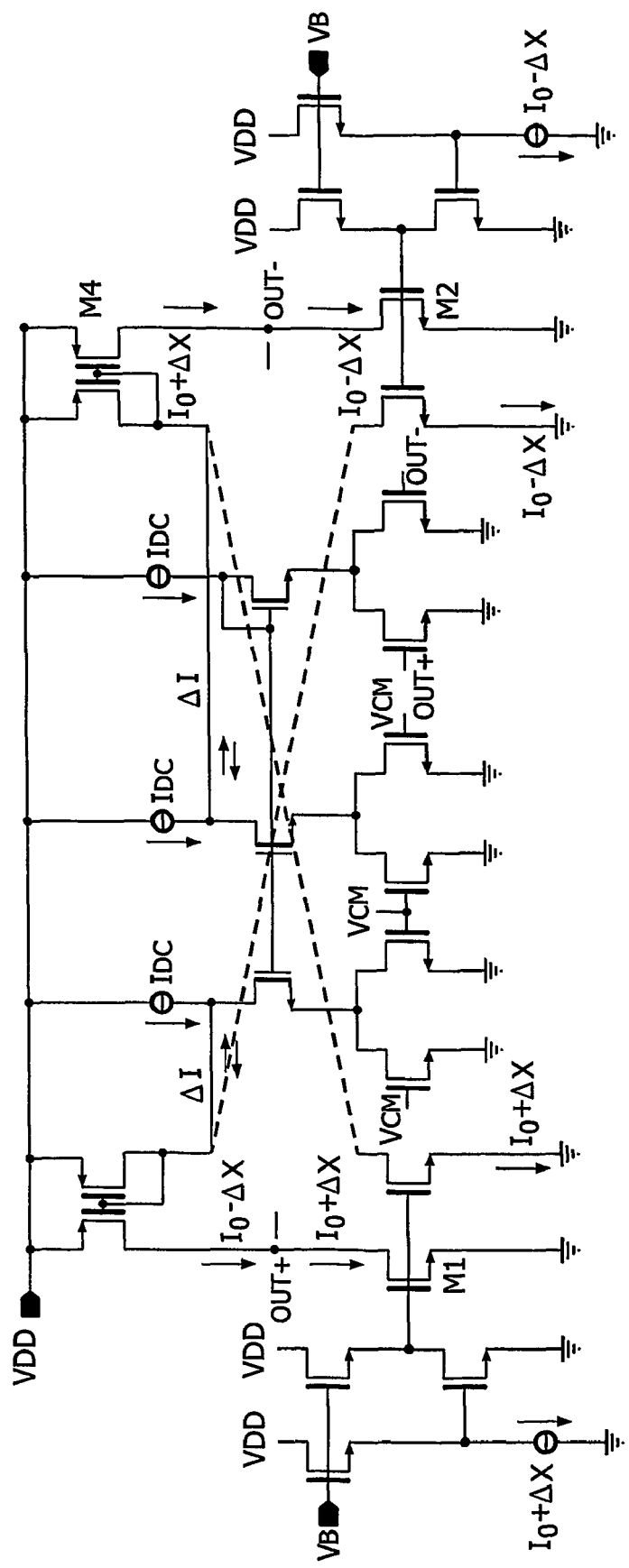

FIG. 1 shows a conventional high speed receiver.
FIG. 2 shows a conventional clock recovery circuit.
FIGS. 3a, 3b and 3c show a conventional charge pump.
FIG. 4 shows two digital input signals UP and DOWN of a charge pump as well as a graph of the output voltage VC of the charge pump versus time t.
FIG. 5 shows a conventional single ended charge pump.
FIG. 6 shows a conventional differential charge pump.
FIGS. 7a, 7b and 7c show another differential charge pump according to the state of the art.
FIG. 8 shows a first embodiment of the present invention.
FIG. 9 shows a second preferred embodiment of the present embodiment.
FIG. 10 shows a third embodiment of the present invention.
FIG. 11 shows a particular implementation of the embodiment of FIG. 9.
FIG. 12 shows a current mirror with inversion used in the charge pump of FIG. 11.
FIG. 13 shows a commode rejection circuit, which may be used in the charge pump of the present invention.
FIG. 14 shows a sense circuit for measuring a common mode at the output of the charge pump according to the present invention.
FIG. 15 shows a fourth embodiment of the present invention.

The first embodiment of the present invention shown in FIG. 8 comprises two output terminals Out+ and Out−. The output terminals are connected to a capacitor C. The charge pump comprises a current source connected to the terminal Out+ and ground. This current source (2) provides a current I0+Δx flowing from the output terminal Out+ to ground. The current source (2) is driven by an input signal, which may be provided, from a phase detector or a frequency detector in a phase locked loop. The variable current Δx is directly proportional to the amplitude of the input signal. Another current source 8 is connected to the output terminal Out+ and an operating voltage VDD. The current provided by the current source 8 is equal to I0−Δx. Therefore, a current of the size 2Δx flows to the output terminal Out+. The output terminal Out+ is connected to the other side of the capacitor C, which is connected to ground via a current source 6, that provides a current I0−Δx. A current source 4 is connected to the output terminal Out− and the operating voltage VDD. A current 2Δx flows from the output terminal Out− to the capacitor C.

FIG. 9 shows a second embodiment of the present invention. The charge pump of FIG. 9 also comprises two output terminals Out+ and Out−. Both output terminals Out+ and Out− are connected to a filter. The filter has the same purpose as the capacitor shown in FIG. 8, namely integrating the current output by the charge pump. In the circuit of FIG. 9 a current equal to I0−Δx is provided to the output terminal Out+ and current I0+Δx is directed away from the output terminal Out+. Therefore, a current equal 2Δx flows from the filter to the output terminal Out+. A current equal I0+Δx is provided to the output terminal Out+ and a current equal to I0−Δx is directed away from the output terminal Out−. The charging of the filter works according to the same principle as the charge pump of FIG. 8. Instead of using four different current sources only two current sources are used in the circuit of FIG. 9. A current source connects the output terminal Out+ with ground. The current I0+Δx is further provided to an input of a current mirror 14 provided in the charge pump of FIG. 9. The current mirror 14 has a current ratio of 1:1. This means, that a current at the output of the current mirror 14 is equal to the current at the input of the current mirror 14. The output out of the current mirror 14 is connected to the output Out− of the charge pump of FIG. 9. Consequently, the current I0+Δx is provided to the output Out−. A current source for providing a current I0−Δx is connected similarly to a current mirror 12. The current mirror 12 also has a mirror ratio of 1:1 and provides the current equal to I0−Δx to the output terminal Out+ of the charge pump.

FIG. 10 shows a third embodiment of the present invention. The charge pump shown in FIG. 10 corresponds largely to the charge pump shown in FIG. 8. Instead of the capacitor C a filter is depicted in FIG. 10. The filter has the same purpose as the capacitor C of the circuit of FIG. 10. In addition FIG. 10 comprises a common mode rejection circuit 22. The circuit 22 is used to control the common mode level at the output of the charge pump, which may vary due to temperature and supply variations. The common mode rejection circuit 22 is connected to the output terminals Out+ and Out−. A voltage difference between Out+ and Out− leads to a change in the output voltage of the pump mode rejection circuit, which functions as an operational amplifier. The voltage output by the common mode rejection circuit 22 controls the current sources 4 and 8 shown in FIG. 10. The current provided by these current sources is either increased or decreased due to the output voltage of the common mode rejection circuit 22.

FIG. 11 shows a transistor level implementation of the charge pump of FIG. 9. A current source 2 provides an input current I0+Δx to an output terminal Out+ of the charge pump. The filter of the charge pump in FIG. 11 comprises two capacitors C. A current source 6 provides an input current I0−Δx to the output terminal Out− of the charge pump. The current source 2 comprises a current source 22. The current I0+Δx of the current source 22 is copied to the transistor M1 and cross-mirrored by a current mirror 14. The current source 6 comprises a current source 26. The current I0−Δx of the current source 26 is copied to the transistor M2 and cross-mirrored by the current mirror 12. In this way the current output at the output terminals Out+ and Out− is two times Δx. The signal current two times Δx flows in the output filter, where the capacitor 2C from FIG. 6 has been represented as a serious connection of two capacitors 2C. The plate of the capacitor 2C with the largest parasitic connected to the common mode of the two capacitors. In this way the parasitic capacitances are not apart of the filter.

FIG. 12 shows the current source 2 of FIG. 11 in detail. The current I0+Δx of the current source is mirrored to the transistor M1. The working principle of the mirror can be found by applying the Kirchoff voltage law:

$$V_{GS5}+V_{GS7}=V_{GS6}+V_{GS1}$$

The circuit of FIG. 12 comprises four transistors M5, M6, M7 and M1. VGS 5 represents the voltage drop across the gate and source of the transistor 5. VGS 7 is the voltage drop cross gate and source transistor M6, VGS 6 represents the voltage drop across the gate and source of transistor M6 and VGS 1 is the gate source voltage drop at transistor M1. Transistor M5 and M6 are connected to a voltage source providing a constant voltage VB. The drains of the transistors M5 and M6 are connected to a voltage source providing a constant voltage VDD. Since the currents of the transistors M6 and M7 are equal we have the extra condition:

$$VGS\ 7 = VGS\ 6$$

In consequence the input current I0+Δx is copied to the output transistors M1, which can work in a rail-to-rail configuration.

FIG. 13 shows a common mode rejection circuit, which may be used with the charge pump of FIG. 11. The common mode rejection circuit outputs an output current ΔI, in order to control the common voltage at the output of a charge pump. The common mode rejection circuit comprises 9 transistors M1 to M9. Transistors M4 and M5 are connected with each other via their drains. The gates of the transistors M4 and M5 are connected to the output terminals Out+ and Out– of the charge pump. The sources of transistors M5 and M4 are connected to ground. Transistors M4 and M5 works as control transistors in the triode regime. Transistors M8 and M9 as well as transistors M7 and M6 are connected to each other in a similar fashion. The gates of the transistors M6, M7, M8 and M9 are connected to a constant reference voltage VCM. The gates of the three transistors M1, M2 and M3 are connected to each other. The drains of transistors M1, M2 and M3 receive a constant current IDC from a current source. Transistors M1 and M2 form a degenerated current mirror. The same applies to transistors 1 and 3. The mirroring ratio at the output of M2 and M3 depends on the ratio of the MOS resistors present on the sources of M1 and M2 as well as M3 respectively. For better understanding, consider FIG. 14 showing the transistors M4 and M5 connected to the output terminals Out+ and Out–. The resistance of the two transistors varies for very small drain sources.

$$R_5(V_1) = \frac{1}{\beta(V_1 - V_T)} \qquad R_4(V_2) = \frac{1}{\beta(V_2 - V_T)}$$

R5 stands for the resistance of the transistor M5 and R4 stands for the resistance of the transistor M4. V1 is the gate source voltage of the transistor M5 and V2 is the gate source voltage of transistor M4. β stands for the differential current gain of both transistors. $V_T$ is the temperature voltage of the transistors M4 and M5. The total resistance of the two transistors M4 and M5 connected in parallel to each other is the following:

$$R = \frac{R_4 R_5}{R_4 + R_5} = \frac{1}{2\beta\left(\frac{V_1+V_2}{2} - V_T\right)} = \frac{1}{2\beta(V_{cm} - V_T)}$$

$V_{CM}$=V1+V2/2 is the common mode voltage of the charge pump. The resistance depends on the common mode voltage as long as $V_{CM}$<VT. By subtracting the DC current IDC at the output of M2 and M3 only the error single +/−ΔI will be transmitted at the output of the circuit. The error signal is a measure of the difference between the common mode voltage $V_{CM}$ at the output terminals Out+ and Out– and the band gap references voltage $V_{CM}$.

FIG. 15 shows a charge pump according to a fourth embodiment of the present invention. The charge pump of FIG. 15 corresponds largely to the charge pump of FIG. 11. The filter having two capacitors 2C connected to the output terminals Out+ and Out– is not shown in FIG. 15. The circuit of FIG. 15 also differs from the circuit of FIG. 11 in that the charge pump of FIG. 15 comprises the common mode rejection circuit of FIG. 13 where as a common mode rejection circuit is not shown in FIG. 11. Otherwise the charge pump of FIG. 15 does not differ from the charge pump shown in FIG. 11. The correction currents ΔI of the common mode rejection circuit contained in FIG. 15 are input to the current mirrors of the phase detector. Thereby the current flowing to the output terminals Out+ and Out– of the charge pump is feedback controlled.

The invention claimed is:

1. Charge pump for providing an output current for charging and discharging a filter in accordance with an input signal, said charge pump comprising:
   a first current source coupled to the input signal for driving the first current source and configured to provide a first current, the first current being generated by adding a variable current (Δx) to a constant current ($I_o$) and the variable current (Δx) being directly proportional to the input signal;
   a second current source coupled to the input signal for driving the second current source and configured to provide a second current, the second current being generated by subtracting the variable current (Δx) from the constant current ($I_o$); and
   an output configured to provide the output current, wherein said output is coupled to both the first and second current source in such a way that the output current is equal to a difference between the first and second current.

2. Charge pump according to claim 1, wherein the first current source is configured to provide the first current to the output and the second current source is configured to receive the second current from the output.

3. Charge pump according to claim 1, wherein the second current source is configured to provide the second current to the output and the first current source is configured to receive the first current from the output.

4. Charge pump according to claim 1, wherein the output comprises a first output terminal and a second output terminal, each output terminal being connected to both the first and second current source in such a way, that the output current at the first and second output terminal is equal to said difference between the first and second current.

5. A charge pump according to claim 4, further comprising:
   a common mode rejection circuit configured to control a common mode level at the output, said common mode rejection circuit being connected to the first and second output terminals and said common mode rejection circuit being configured to add and subtract the same current from both the first and second current sources.

6. The charge pump of claim 4, further comprising:
a first current mirror having a mirror ratio 1:1 and configured to mirror the first current provided to the first output terminal to the second output terminal, and
a second current minor having a mirror ratio 1:1 and configured to minor the second current provided to the second output terminal to the first output terminal.

7. The charge pump of claim 5, further comprising:
a first current mirror having a mirror ratio 1:1 and configured to mirror the first current provided to the first output terminal to the second output terminal, and
a second current mirror having a mirror ratio 1:1 and configured to mirror the second current provided to the second output terminal to the first output terminal.

8. The charge pump of claim 1, wherein the input signal is an output signal of a phase detector, and the variable current ($\Delta x$) of the first and second current sources is directly proportional to the output signal of the phase detector.

9. The charge pump of claim 1, wherein the input signal is an output signal of a frequency detector, and the variable current ($\Delta x$) of the first and second current sources is directly proportional to the output signal of the frequency detector.

10. A charge pump for providing an output current for charging and discharging a filter in accordance with an input signal, said charge pump comprising:
a first current source coupled to the input signal for driving the first current source and configured to provide a first current, the first current being generated by adding a variable current ($\Delta x$) to a constant current ($I_o$);
a second current source coupled to the input signal for driving the second current source and configured to provide a second current, the second current being generated by subtracting the variable current ($\Delta x$) from the constant current ($I_o$); and
an output configured to provide the output current, wherein said output is coupled to both the first and second current source in such a way that the output current is equal to a difference between the first and second current, wherein the output comprises a first output terminal and a second output terminal, each output terminal being connected to both the first and second current source; and
wherein the input signal is an output signal of a one of a phase detector and a frequency detector, and the variable current ($\Delta x$) of the first and second current sources is directly proportional to the input signal.

* * * * *